United States Patent
Nakagawa

(10) Patent No.: US 12,477,844 B2
(45) Date of Patent: Nov. 18, 2025

(54) PHOTOELECTRIC CONVERSION APPARATUS, PHOTOELECTRIC CONVERSION SYSTEM USING PHOTOELECTRIC CONVERSION APPARATUS, AND MOVING OBJECT

(71) Applicant: CANON KABUSHIKI KAISHA, Tokyo (JP)

(72) Inventor: Yoshiyuki Nakagawa, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 599 days.

(21) Appl. No.: 17/820,524

(22) Filed: Aug. 17, 2022

(65) Prior Publication Data

US 2023/0060602 A1    Mar. 2, 2023

(30) Foreign Application Priority Data

Aug. 27, 2021   (JP) .................................. 2021-138747

(51) Int. Cl.
*H10F 39/00*    (2025.01)

(52) U.S. Cl.
CPC ........ *H10F 39/8023* (2025.01); *H10F 39/011* (2025.01); *H10F 39/803* (2025.01); *H10F 39/807* (2025.01)

(58) Field of Classification Search
CPC . H10D 84/85–859; H10D 84/907–994; H10D 84/0165–0195; H10D 84/0193; H10D 84/853; B81C 2203/0728; B81C 2203/0735; B81C 2203/0742; H10F 39/014; H10F 39/80–807

See application file for complete search history.

(56) References Cited

U.S. PATENT DOCUMENTS

| | | | | |
|---|---|---|---|---|
| 2015/0288897 A1* | 10/2015 | Ohgishi | ............... | H10F 39/182 348/302 |
| 2017/0287955 A1* | 10/2017 | Ukigaya | ............... | H10F 39/199 |
| 2019/0371836 A1* | 12/2019 | Ogino | ................ | H10F 39/8057 |

FOREIGN PATENT DOCUMENTS

JP    2009088430 A    4/2009

* cited by examiner

*Primary Examiner* — Christine S. Kim
*Assistant Examiner* — Cole Leon Lindsey
(74) *Attorney, Agent, or Firm* — Canon U.S.A., Inc. IP Division

(57) ABSTRACT

An apparatus includes a substrate, wherein the substrate includes a conversion unit and a circuit region where a signal generated by the conversion unit is processed, wherein the circuit region includes a p-type semiconductor region and an n-type semiconductor region, wherein a film having a negative fixed charge is provided on the surface side of the p-type semiconductor region, wherein a film having a positive fixed charge is provided on the surface side of the n-type semiconductor region, and wherein the film having the negative fixed charge and the film having the positive fixed charge are aligned in a direction parallel to the surface.

15 Claims, 16 Drawing Sheets

PHOTOELECTRIC CONVERSION APPARATUS, PHOTOELECTRIC CONVERSION SYSTEM USING PHOTOELECTRIC CONVERSION APPARATUS, AND MOVING OBJECT

BACKGROUND

Technical Field

The aspect of the embodiments relates to a photoelectric conversion apparatus, a photoelectric conversion system using the photoelectric conversion apparatus, and a moving object.

Description of the Related Art

In a manufacturing process of a photoelectric conversion apparatus, if a lattice defect or the like occurs in a substrate crystal by processing such as etching, the lattice defect can be a noise source such as a dark current. Japanese Patent Application Laid-Open No. 2009-88430 discusses a method of manufacturing a photoelectric conversion apparatus by forming a layer having negative fixed electric charges on a light incidence side of a sensor section in order to form a hole accumulation layer, and then removing the layer having negative fixed electric charges on a peripheral circuit section.

SUMMARY

According to an aspect of the embodiments, an apparatus including a substrate includes a surface, wherein the substrate includes a conversion unit and a circuit region where a signal generated by the conversion unit is to be processed, wherein the circuit region includes a p-type semiconductor region and an n-type semiconductor region at positions different from each other in a plan view from a surface side, wherein a film having a negative fixed charge is provided on the surface side of the p-type semiconductor region, wherein a film having a positive fixed charge is provided on the surface side of the n-type semiconductor region, and wherein the circuit region includes one or both of a configuration in which the film having the positive fixed charge does not extend from the surface side of the n-type semiconductor region to the surface side of the p-type semiconductor region or extends to a part of the surface side of the p-type semiconductor region and a configuration in which the film having the negative fixed charge does not extend from the surface side of the p-type semiconductor region to the surface side of the n-type semiconductor region or extends to a part of the surface side of the n-type semiconductor region.

According to another aspect of the embodiments, a method for manufacturing an apparatus including a substrate, the substrate including a conversion unit and a circuit region where a signal generated by the conversion unit is to be processed, and the circuit region including a p-type semiconductor region and an n-type semiconductor region, the method includes forming a film having a negative fixed charge on a surface side of the substrate to cover the p-type semiconductor region and the n-type semiconductor region, and removing the film having the negative fixed charge from the surface side of the n-type semiconductor region and leaving the film having the negative fixed charge on the surface side of the p-type semiconductor region.

According to yet another aspect of the embodiments, a method for manufacturing an apparatus including a substrate the substrate including a conversion unit and a circuit region where a signal generated by the conversion unit is to be processed, and the circuit region including a p-type semiconductor region and an n-type semiconductor region, the method includes forming a film having a negative fixed charge on a surface side of the substrate to cover the p-type semiconductor region and the n-type semiconductor region, and forming a film having a positive fixed charge on the surface side of the n-type semiconductor region and not forming a film having a positive fixed charge on the surface side of the p-type semiconductor region.

According to yet another aspect of the embodiments, a substrate includes a conversion unit, and a circuit region where a signal generated by the conversion unit is to be processed, wherein the circuit region includes a p-type semiconductor region and an n-type semiconductor region, wherein a film having a negative fixed charge is provided on a surface side of a region overlapping the p-type semiconductor region in a plan view from the surface side, wherein a film having a positive fixed charge is provided on the surface side of the n-type semiconductor region, and wherein the film having the negative fixed charge and the film having the positive fixed charge are aligned in a direction parallel to the surface.

Further features of the disclosure will become apparent from the following description of exemplary embodiments with reference to the attached drawings.

DESCRIPTION OF THE EMBODIMENTS

A photoelectric conversion apparatus according to exemplary embodiments of the disclosure will be described with reference to the attached drawings.

In each exemplary embodiment described below, an image capturing apparatus is mainly described as an example of a photoelectric conversion apparatus to which the disclosure can be applied, but the application of each exemplary embodiment is not limited to the image capturing apparatus. For example, each exemplary embodiment can be applied to a ranging apparatus (an apparatus for focus detection and for distance detection using time of flight (TOF)), a light metering apparatus (an apparatus for measuring an incident light amount), and the like.

A conductivity type of a semiconductor region such as a diffusion region and a well and a dopant to be implanted, which are to be described in the below-described exemplary embodiments, are examples and the disclosure is not limited only to those described in the exemplary embodiments. The conductivity type and the dopant can be appropriately changed from those described in the exemplary embodiments, and, along with this change, potential of the semiconductor region such as the diffusion region and the well is appropriately changed.

A first exemplary embodiment for implementing the disclosure is to be described with reference to FIGS. 1 and 2.

Figure 1:
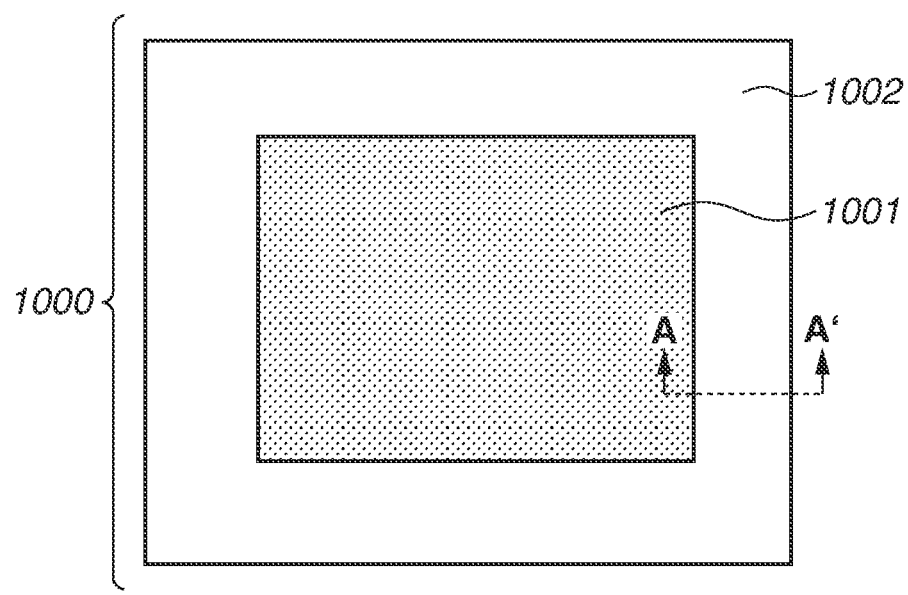
FIG. 1 is a schematic diagram of a photoelectric conversion apparatus according to a first exemplary embodiment.

FIG. 1 is a schematic diagram of a photoelectric conversion apparatus according to the first exemplary embodiment. The photoelectric conversion apparatus according to the present exemplary embodiment is a back-illuminated complementary metal oxide semiconductor (CMOS) image sensor using a negative type (n-type) semiconductor substrate.

A photoelectric conversion apparatus 1000 illustrated in FIG. 1 includes a pixel region 1001 in which a plurality of pixels is arranged and a peripheral circuit region 1002 in which a circuit for controlling drive of each pixel in the pixel region 1001 and for processing and outputting a signal obtained by each pixel is arranged. The number of pixels included in the pixel region 1001 is not particularly limited. For example, the pixel region 1001 may be formed of pixels of thousands of rows by thousands of columns as in a common digital camera or a plurality of pixels arranged in one row or one column.

Figure 2:
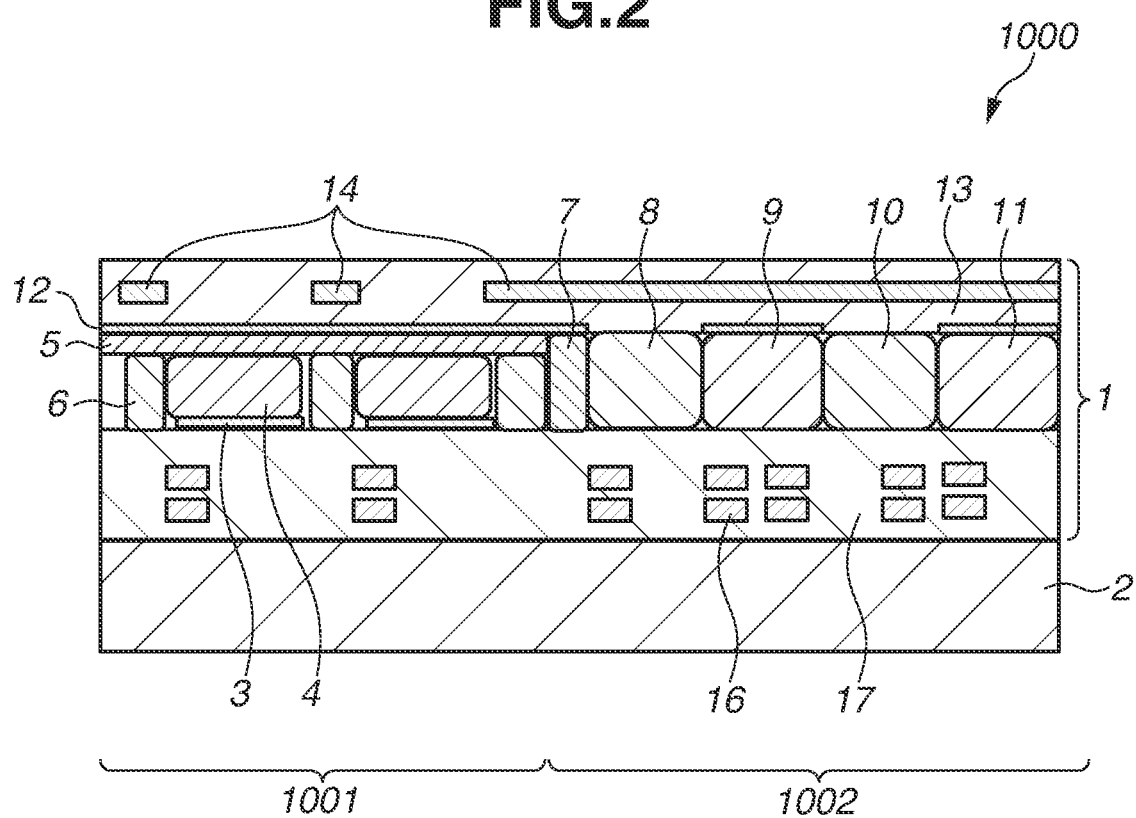
FIG. 2 is a schematic cross-sectional view of the photoelectric conversion apparatus according to the first exemplary embodiment.

FIG. 2 is a schematic cross-sectional view of the photoelectric conversion apparatus 1000 according to the first exemplary embodiment along an A-A' line in FIG. 1.

The photoelectric conversion apparatus 1000 illustrated in FIG. 2 includes a substrate 1 including a semiconductor substrate and a support substrate 2. An upper surface (an uppermost surface) in FIG. 2 is a light incident surface of the substrate 1. The support substrate 2 for reinforcing strength of the substrate 1 is provided on an opposite surface of the light incidence surface. In FIG. 2, light is incident on the light incident surface of the substrate 1 from above.

The substrate 1 further includes a negative fixed charge film 12, a positive fixed charge film 13, and a light shielding film 14 on a light incidence surface side of the semiconductor substrate, and includes wiring 16 and an interlayer film 17 on an opposite side of the light incidence surface of the semiconductor substrate.

The substrate 1 includes an n-type semiconductor substrate. As the n-type semiconductor substrate, for example, a silicon substrate into which an n-type impurity is implanted can be used. The substrate 1 includes a first positive type (p-type) diffusion region 3, a first n-type diffusion region 4, a second p-type diffusion region 5, and a third p-type diffusion region 6 as semiconductor regions in the semiconductor substrate. The substrate 1 further includes a first p-type well 7, a first n-type well 8, a second p-type well 9, a second n-type well 10, and a third p-type well 11 as the semiconductor regions.

As the support substrate 2, for example, a silicon substrate can be used. The substrate 1 and the support substrate 2 can be bonded by, for example, a plasma activated bonding method. The support substrate 2 may be provided with a transistor and wiring, which are not illustrated, and have a function of electrically connecting to the substrate 1 and processing a signal output from the substrate 1.

An arrangement and a function of each element in the substrate 1 are to be described.

The first p-type diffusion region 3, the first n-type diffusion region 4, the second p-type diffusion region 5, and the third p-type diffusion region 6 are arranged in the pixel region 1001 on the semiconductor substrate of the substrate 1 to form an electron accumulation type photodiode as a photoelectric conversion unit. Further, a transfer transistor, a reset transistor, a selection transistor, and an amplification transistor, which are not illustrated, are arranged in the pixel region 1001. The light incident on the light incidence surface of the pixel region 1001 is photoelectrically converted at an interface between the diffusion region 3 or 5 and the diffusion region 4, and a generated electron is accumulated in the first n-type diffusion region 4.

The first p-type well 7, the first n-type well 8, the second p-type well 9, the second n-type well 10, and the third p-type well 11 are arranged in the peripheral circuit region 1002 on the semiconductor substrate of the substrate 1. In each well, devices used for performing signal processing such as a transistor and a resistor, which are not illustrated, are arranged.

The negative fixed charge film 12 is formed on the light incidence surface side of the second p-type diffusion region 5, the first p-type well 7, the second p-type well 9, and the third p-type well 11. Meanwhile, the positive fixed charge film 13 is formed on the light incidence surface side of the first n-type well 8 and the second n-type well 10.

The negative fixed charge film 12 can be formed of, for example, aluminum oxide, hafnium oxide, tantalum oxide, titanium oxide, and zirconium oxide. The negative fixed charge film 12 is not limited to the above-described configuration and can include other types of films and a combination of a plurality of types of films within a scope in which it has a function of having a negative fixed charge.

Meanwhile, the positive fixed charge film 13 can be formed of a silicon oxide film and a silicon nitride film and may include other films and a combination of a plurality of types of films within a scope in which it has a function of having a positive fixed charge. In the present description, a silicon oxide film is used as a material of the positive fixed charge film 13, and the positive fixed charge film 13 also has a function of insulation between wiring as an interlayer film of the pixel region and the peripheral circuit region.

The light shielding film 14 is formed in the positive fixed charge film 13 so as to cover the peripheral circuit region and a gap between pixels and reduces occurrence of stray light and color mixture. Further, a color filter, a microlens, a waveguide, and the like, which are not illustrated, may be formed on the light incidence surface side of the photoelectric conversion apparatus 1000, and thus it is possible to collect the light for each color and to efficiently take the collected light into a photodiode portion (the diffusion regions 3 to 6).

The negative fixed charge film 12 and the positive fixed charge film 13 are arranged to align in a direction parallel to the light incidence surface as illustrated in FIG. 2, and thus a hole accumulation layer generated by the negative fixed charge film 12 is connected to each of the second p-type diffusion region 5 and the first to the third p-type wells 7, 9, and 11. An electron accumulation layer generated by the positive fixed charge film 13 is connected to each of the first n-type well 8 and the second n-type well 10, so that a potential difference is generated between the same conductivity type semiconductor regions, and the semiconductor regions can be separated from each other.

Accordingly, for example, a leakage current can be reduced that can be generated among the same conductivity type semiconductor regions such as the first p-type well 7 and the second p-type well 9 or the third p-type well 11. Similarly, a leakage current can be reduced that can be generated between the first n-type well 8 and the second n-type well 10.

FIG. 2 illustrates an example in which the negative fixed charge film 12 and the positive fixed charge film 13 are aligned in the direction parallel to the light incidence surface, and the arrangement of the negative fixed charge film 12 and the positive fixed charge film 13 is not limited to this example. For example, even if surface positions of the negative fixed charge film 12 and the positive fixed charge film 13 are shifted from each other in a height direction perpendicular to the light incidence surface, it can be said that the negative fixed charge film 12 and the positive fixed charge film 13 are aligned if the negative fixed charge film 12 and the positive fixed charge film 13 are provided at a certain height. A state in which the negative fixed charge film 12 and the positive fixed charge film 13 are aligned is not limited to a case in which they are next to each other, and another member may be provided between the negative fixed charge film 12 and the positive fixed charge film 13.

In FIG. 2, the negative fixed charge film 12 is arranged in regions on the second p-type diffusion region 5 and the first to the third p-type wells 7, 9, and 11, but the arrangement of the negative fixed charge film 12 is not limited to this arrangement.

As long as a leakage current can be reduced, for example, the negative fixed charge film 12 may partially protrude onto the first n-type well 8 or may be arranged in a region overlapping a part of the second p-type well region.

An insulation film not illustrated may be formed between the negative fixed charge film 12, the positive fixed charge film 13, and the second p-type diffusion region 5 or the first to the third p-type wells 7, 9, and 11 within a scope in which they do not lose their charge fixation function. The formed insulation film can be used as an etching stop film in a case where etching is performed on regions of the negative fixed charge film 12 overlapping the first n-type well 8 and the second n-type well 10 and can reduce damage to the substrate due to etching. In this case, the negative fixed charge film 12 remains on the first to the third p-type wells 7, 9, and 11, so that damaging the substrate can be prevented during etching.

As described above, the present exemplary embodiment can suppress occurrence of damage during processing and generation of noise due to the damage.

The configuration described above can also be paraphrased as follows. The peripheral circuit region includes the negative fixed charge film on the light incidence surface side of the p-type well and the positive fixed charge film on the light incidence surface side of the n-type well. The positive fixed charge film does not extend from the light incidence surface side of the n-type well to the light incidence surface side of the p-type well, or extends to a part of the light incidence surface side of the p-type well. Alternatively, the negative fixed charge film does not extend from the light incidence surface side of the p-type well to the light incidence surface side of the n-type well, or extends to a part of the light incidence surface side of the n-type well.

A second exemplary embodiment for implementing the disclosure is to be described with reference to FIGS. 3 and 4.

Figure 3:
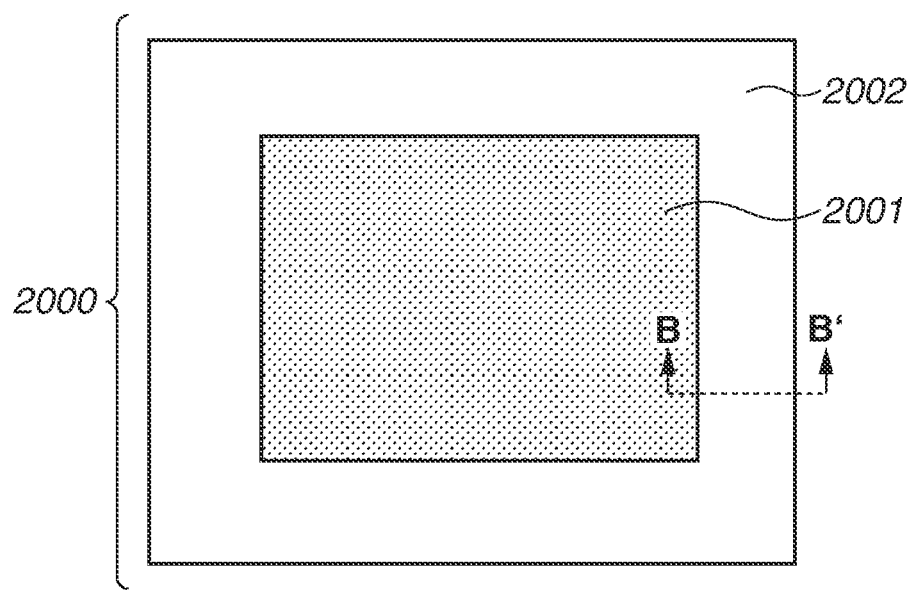
FIG. 3 is a schematic diagram of a photoelectric conversion apparatus according to a second exemplary embodiment.

FIG. 3 is a schematic diagram of a photoelectric conversion apparatus according to the second exemplary embodiment. The photoelectric conversion apparatus according to the present exemplary embodiment is a back-illuminated CMOS image sensor using a p-type semiconductor substrate.

A photoelectric conversion apparatus 2000 illustrated in FIG. 3 includes a pixel region 2001 in which a plurality of pixels is arranged and a peripheral circuit region 2002 in which a circuit for controlling drive of each pixel in the pixel region 2001 and for processing and outputting a signal obtained by each pixel is arranged. The number of pixels included in the pixel region 2001 is not particularly limited. For example, the pixel region 2001 may be formed of pixels of thousands of rows by thousands of columns as in a common digital camera or a plurality of pixels arranged in one row or one column.

Figure 4:
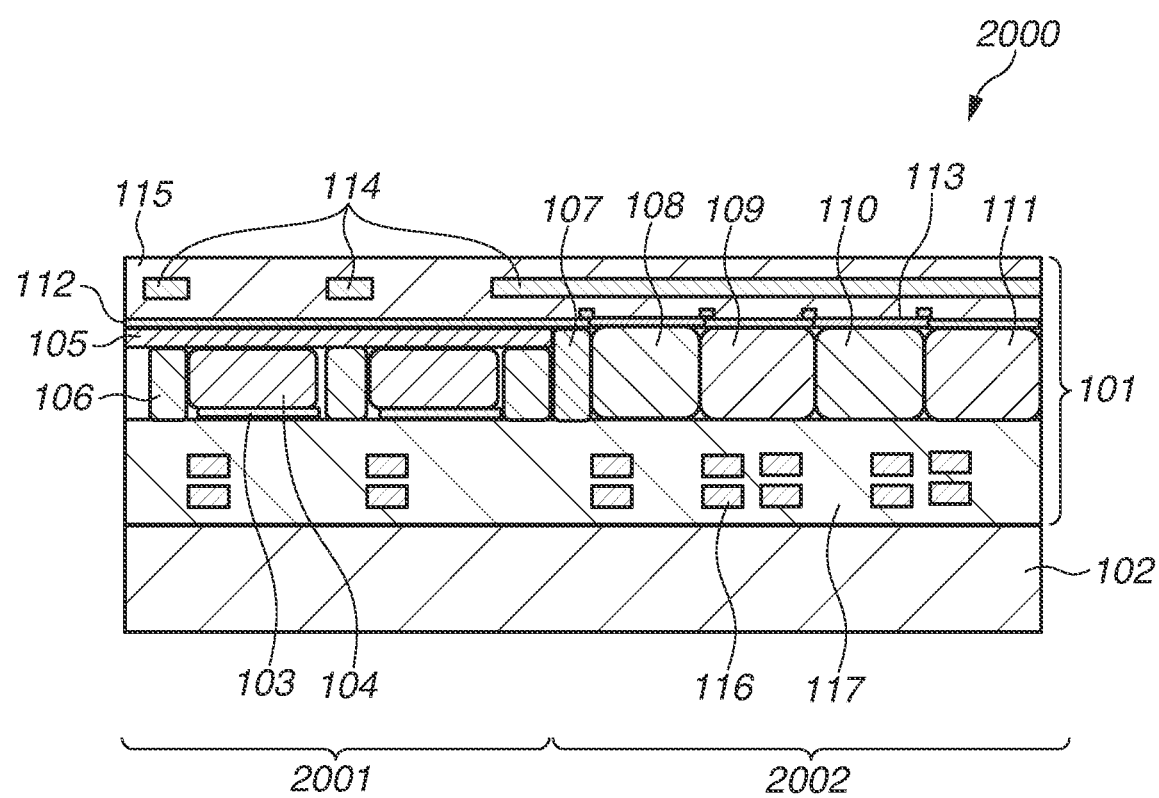
FIG. 4 is a schematic cross-sectional view of the photoelectric conversion apparatus according to the second exemplary embodiment.

FIG. 4 is a schematic cross-sectional view of the photoelectric conversion apparatus 2000 according to the second exemplary embodiment along a B-B' line in FIG. 3.

The photoelectric conversion apparatus 2000 illustrated in FIG. 4 includes a substrate 101 including a semiconductor substrate and a support substrate 102. An upper surface (an uppermost surface) in FIG. 4 is a light incident surface of the substrate 101. The support substrate 102 for reinforcing strength of the substrate 101 is provided on an opposite surface of the light incidence surface of the substrate 101. In FIG. 4, light is incident on the light incident surface of the semiconductor substrate from above.

The substrate 101 further includes a negative fixed charge film 113, a positive fixed charge film 112, and a light shielding film 114 on a light incidence surface side of the semiconductor substrate, and wiring 116 and an interlayer film 117 on an opposite side of the light incidence surface of the semiconductor substrate.

The substrate 101 includes a p-type semiconductor substrate. As the semiconductor substrate, for example, a silicon substrate into which a p-type impurity is implanted can be used. The substrate 101 includes a first n-type diffusion region 103, a first p-type diffusion region 104, a second n-type diffusion region 105, and a third n-type diffusion region 106 as semiconductor regions in the semiconductor substrate. The substrate 101 further includes a first n-type well 107, a first p-type well 108, a second n-type well 109, a second p-type well 110, and a third n-type well 111 as the semiconductor regions.

As the support substrate 102, for example, a silicon substrate can be used. The substrate 101 and the support substrate 102 can be bonded by, for example, the plasma activated bonding method. The support substrate 102 may be provided with a transistor and wiring, which are not illustrated, and have a function of electrically connecting to the substrate 101 and processing a signal output from the substrate 101.

An arrangement and a function of each element in the substrate 101 are to be described.

The first n-type diffusion region 103, the first p-type diffusion region 104, the second n-type diffusion region 105, and the third n-type diffusion region 106 are arranged in the pixel region 2001 on the semiconductor substrate of the substrate 101 to form a hole accumulation type photodiode as a photoelectric conversion unit. Further, a transfer transistor, a reset transistor, a selection transistor, and an amplification transistor, which are not illustrated, are arranged in the pixel region 2001. The light incident on the light incidence surface of the pixel region 2001 is photoelectrically converted at an interface between the diffusion region 103 or 105 and the diffusion region 104, and a generated hole is accumulated in the first p-type diffusion region 104.

The first n-type well 107, the first p-type well 108, the second n-type well 109, the second p-type well 110, and the third n-type well 111 are arranged in the peripheral circuit region 2002 on the semiconductor substrate of the substrate 101. In each well, devices used for performing signal processing such as a transistor and a resistor, which are not illustrated, are arranged.

The positive fixed charge film 112 is formed on the light incidence surface side of the second n-type diffusion region 105, the first n-type well 107, the second n-type well 109, and the third n-type well 111. Meanwhile, the negative fixed charge film 113 is formed on the light incidence surface side of the first p-type well 108 and the second p-type well 110.

The positive fixed charge film 112 can be formed of a silicon oxide film and a silicon nitride film.

The positive fixed charge film 112 is not limited to the above-described configuration and may include other films and a combination of a plurality of types of films within a scope in which it has a function of having a positive fixed charge.

Meanwhile, the negative fixed charge film 113 can be formed of a film of, for example, aluminum oxide, hafnium oxide, tantalum oxide, titanium oxide, and zirconium oxide. The film is not limited to the above composition and can include other types of films and a combination of a plurality of types of films within a scope in which it has a function of having a negative fixed charge.

The positive fixed charge film 112 and the negative fixed charge film 113 are arranged to align in a direction parallel to the light incidence surface as described above, and thus an electron accumulation layer generated by the positive fixed charge film 112 is connected to the second n-type diffusion region 105 and the first to the third n-type wells 107, 109, and 111. A hole accumulation layer generated by the negative fixed charge film 113 is connected to the first p-type well 108 and the second p-type well 110, so that a potential difference is formed between the same conductivity type semiconductor regions, and the semiconductor regions can be separated from each other.

Accordingly, for example, a leakage current can be reduced that can be generated among the same conductivity type semiconductor regions such as the first n-type well 107, the second n-type well 109, and the third n-type well 111. Similarly, a leakage current can be reduced that can be generated between the first p-type well 108 and the second p-type well 110.

According to the present exemplary embodiment, the positive fixed charge film 112 is formed, and subsequently, the negative fixed charge film 113 is formed. At the time of forming the negative fixed charge film 113, the negative fixed charge film 113 is formed so that an end-edge of the negative fixed charge film 113 is laid over the positive fixed charge film 112, and thus damage to the n-type well and the p-type well during etching can be reduced.

An interlayer film 115 is formed further on the light incidence surface side of the positive fixed charge film 112 and the negative fixed charge film 113. As the interlayer film 115, a film that does not cancel the function of having a fixed charge of the positive fixed charge film 112 and the negative fixed charge film 113 is selected. Specifically, a film including a nitride or the like is used as the interlayer film 115. The light shielding film 114 is formed in the interlayer film 115 so as to cover the peripheral circuit region and a gap between pixels. The light shielding film 114 as described above reduces occurrence of stray light and color mixture. Further, a color filter, a microlens, a waveguide, and the like, which are not illustrated, may be formed on the light incidence surface side of the interlayer film 115, and thus it is possible to collect the light for each color and to efficiently take the collected light into a photodiode portion (the diffusion regions 103 to 106).

The configuration described above can also be paraphrased as follows. The peripheral circuit region includes the negative fixed charge film on the light incidence surface side of the p-type well and the positive fixed charge film on the light incidence surface side of the n-type well. The positive fixed charge film does not extend from the light incidence surface side of the n-type well to the light incidence surface side of the p-type well, or extends to a part of the light incidence surface side of the p-type well. Further, the negative fixed charge film does not extend from the light incidence surface side of the p-type well to the light incidence surface side of the n-type well, or extends to a part of the light incidence surface side of the n-type well.

A third exemplary embodiment for implementing the disclosure is to be described with reference to FIGS. 5 and 6.

Figure 5:
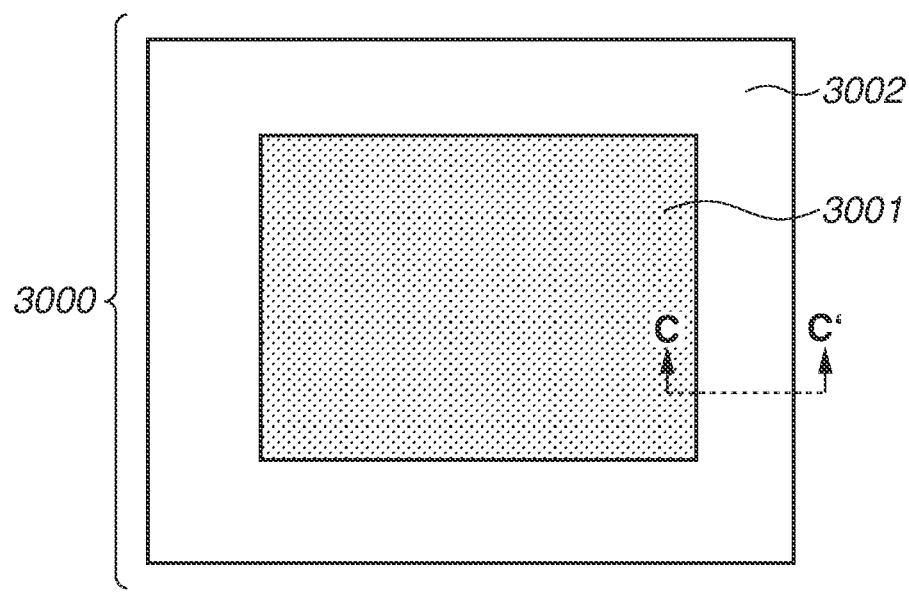
FIG. 5 is a schematic diagram of a photoelectric conversion apparatus according to a third exemplary embodiment.

FIG. 5 is a schematic diagram of a photoelectric conversion apparatus according to the third exemplary embodiment. A photoelectric conversion apparatus 3000 according to the present exemplary embodiment is a back-illuminated CMOS image sensor using an n-type semiconductor substrate.

The photoelectric conversion apparatus 3000 illustrated in FIG. 5 includes a pixel region 3001 in which a plurality of pixels is arranged and a peripheral circuit region 3002 in which a circuit for controlling drive of each pixel in the pixel region 3001 and for processing and outputting a signal obtained by each pixel is arranged. The number of pixels included in the pixel region 3001 is not particularly limited. For example, the pixel region 3001 may be formed of pixels of thousands of rows by thousands of columns as in a common digital camera or a plurality of pixels arranged in one row or one column.

Figure 6:
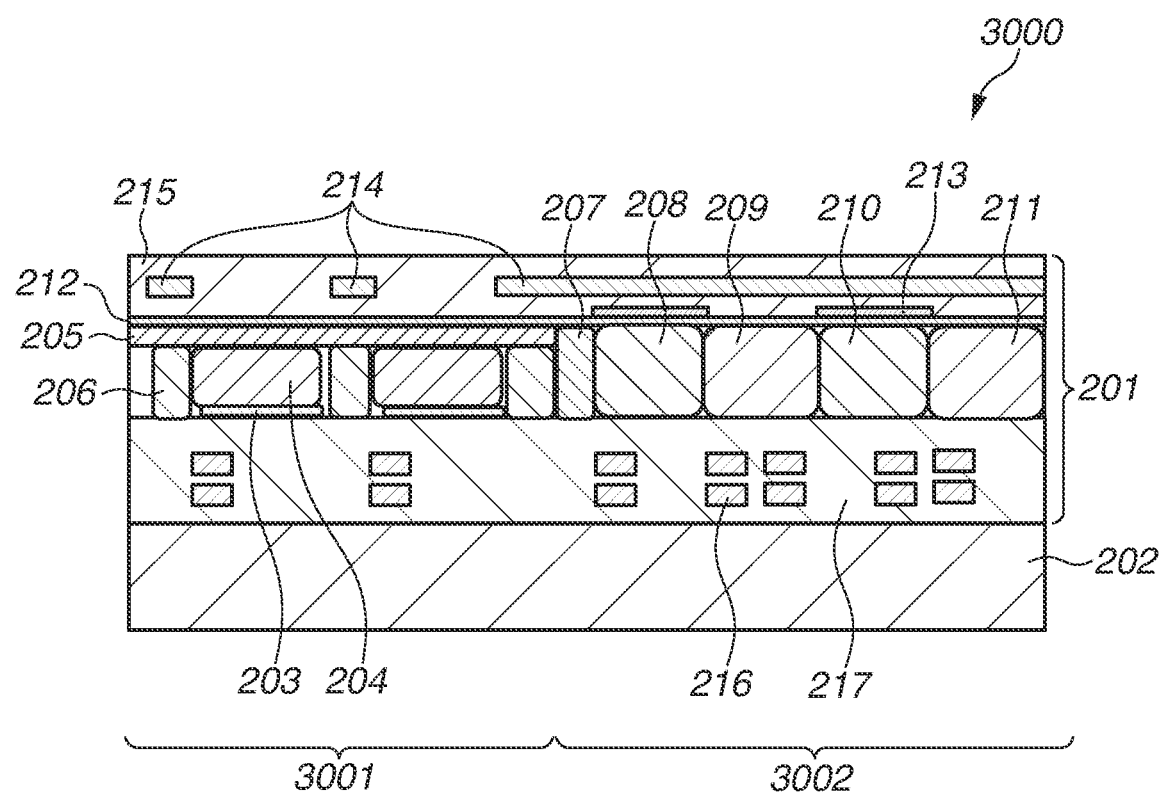
FIG. 6 is a schematic cross-sectional view of the photoelectric conversion apparatus according to the third exemplary embodiment.

FIG. 6 is a schematic cross-sectional view of the photoelectric conversion apparatus 3000 according to the third exemplary embodiment along a C-C' line in FIG. 5.

The photoelectric conversion apparatus 3000 illustrated in FIG. 6 includes a substrate 201 including a semiconductor substrate and a support substrate 202. An upper surface (an uppermost surface) in FIG. 6 is a light incident surface of the substrate 201. The support substrate 202 for reinforcing strength of the substrate 201 is provided on an opposite surface of the light incidence surface.

The substrate 201 further includes a negative fixed charge film 212, a positive fixed charge film 213, and a light shielding film 214 on a light incidence surface side of the semiconductor substrate, and wiring 216 and an interlayer film 217 on an opposite side of the light incidence surface of the semiconductor substrate.

The substrate 201 includes an n-type semiconductor substrate, and as the semiconductor substrate, for example, a silicon substrate into which an n-type impurity is implanted can be used.

The substrate 201 includes a first p-type diffusion region 203, a first n-type diffusion region 204, a second p-type diffusion region 205, and a third p-type diffusion region 206 as semiconductor regions in the semiconductor substrate. The substrate 201 further includes a first p-type well 207, a first n-type well 208, a second p-type well 209, a second n-type well 210, and a third p-type well 211 as the semiconductor regions.

An arrangement and a function of each element in the substrate 201 are to be described.

The first p-type diffusion region 203, the first n-type diffusion region 204, the second p-type diffusion region 205, and the third p-type diffusion region 206 are arranged in the pixel region 3001 on the semiconductor substrate of the substrate 201 to form an electron accumulation type photodiode as a photoelectric conversion unit. Further, a transfer transistor, a reset transistor, a selection transistor, and an amplification transistor, which are not illustrated, are arranged in the pixel region 3001. The light incident on the light incidence surface is photoelectrically converted at an interface between the diffusion region 203 or 205 and the diffusion region 204, and a generated electron is accumulated in the first n-type diffusion region 204.

The first p-type well 207, the first n-type well 208, the second p-type well 209, the second n-type well 210, and the third p-type well 211 are arranged in the peripheral circuit region 3002 on the semiconductor substrate of the substrate 201. In each well, devices used for performing signal processing such as a transistor and a resistor, which are not illustrated, are arranged.

According to the present exemplary embodiment, the negative fixed charge film 212 is formed on the light incidence surface side of the second p-type diffusion region 205 and the wells 207 to 211. Further, the positive fixed charge film 213 is formed on the light incidence surface side of the first n-type well 208 and the second n-type well 210. In other words, the negative fixed charge film 212 formed on the second p-type well 209 extends between the first n-type well 208, the second n-type well 210, and the positive fixed charge film 213.

The negative fixed charge film 212 and the positive fixed charge film 213 are arranged to align in a direction parallel to the light incidence surface as illustrated in FIG. 6, and thus a hole accumulation layer generated by the negative fixed charge film 212 is connected to the second p-type diffusion region 205 and the first to the third p-type wells 207, 209, and 211.

In this case, a depletion layer enhanced by the negative fixed charge film 212 is divided by the positive fixed charge film 213 formed on the negative fixed charge film 212. For this reason, the same conductivity type regions such as the first n-type well 208 and the second n-type well 210 can be potentially separated from each other. Accordingly, for example, a leakage current can be reduced that can be generated among the same conductivity type regions such the first p-type well 207, the second p-type well 209, and the third p-type well 211. Similarly, a leakage current can be reduced that can be generated between the first n-type well 208 and the second n-type well 210.

In FIG. 6, the light shielding film 214 is formed in an interlayer film 215 so as to cover the peripheral circuit region and a gap between pixels and reduces occurrence of stray light and color mixture. Further, a color filter, a microlens, a waveguide, and the like, which are not illustrated, may be formed on the light incidence surface side of the substrate 201, and thus it is possible to collect the light for each color and to efficiently take the collected light into a photodiode portion (the diffusion region 203 to 206).

According to the present exemplary embodiment, the case is described in which the hole accumulation type photodiode is formed on the n-type semiconductor substrate, but the present exemplary embodiment may be applied to a case in which an electron accumulation type photodiode is formed on a p-type semiconductor substrate. In this case, the positive fixed charge film is formed on the light incidence surface side in a portion overlapping each of the p-type well and the n-type well in a plan view, and the negative fixed charge film is formed in a portion overlapping the p-type well in a plan view.

The above-described configuration can be obtained by, for example, forming the positive fixed charge film on the light incidence surface side of a region extending from the n-type diffusion region in the pixel region to the n-type well and the p-type well in the peripheral circuit region and further forming the negative fixed charge film on the light incidence surface side of the p-type well. In this case, the positive fixed charge film formed on the n-type well extends between the p-type well and the negative fixed charge film. In other words, the positive fixed charge film extends on the region from the p-type well to the n-type well, and the negative fixed charge film does not extend on the region from the p-type well to the n-type well or extends on a part of the n-type well.

A manufacturing method of the photoelectric conversion apparatus according to the first exemplary embodiment is to be described as a fourth exemplary embodiment for implementing the disclosure with reference to FIGS. 1 and 7 to 13. FIGS. 7 to 13 are schematic cross-sectional views of the photoelectric conversion apparatus according to the first exemplary embodiment in manufacturing processes, and cross sections in these schematic cross-sectional views correspond to the cross section of the photoelectric conversion apparatus 1000 along the A-A' line in FIG. 1.

Figure 7:
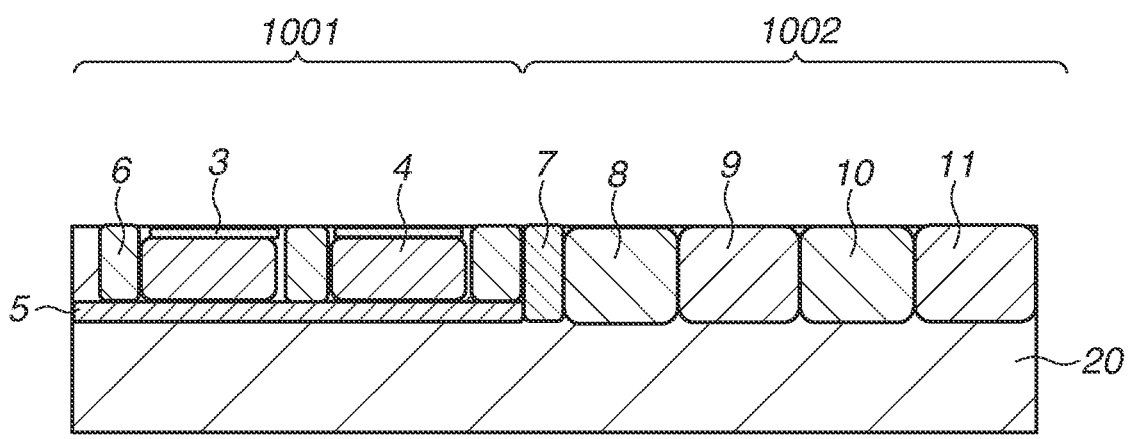
FIG. 7 is an explanatory diagram illustrating a manufacturing method of a photoelectric conversion apparatus according to a fourth exemplary embodiment.

FIG. 7 is to be described.

First, a silicon substrate 20 (a semiconductor substrate) into which an n-type impurity is implanted is prepared. In FIG. 7, a surface corresponding to the light incidence surface of the photoelectric conversion apparatus 1000 is illustrated as a lower side. A groove (a trench) for element isolation is formed by a known method, and an element isolation region not illustrated is formed by embedding an insulating material such as silicon oxide into the trench.

Next, the first p-type diffusion region 3, the first n-type diffusion region 4, the second p-type diffusion region 5, the third p-type diffusion region 6, the first p-type well 7, the first n-type well 8, the second p-type well 9, the second n-type well 10, and the third p-type well 11 are formed. They each can be formed at a desired depth and concentration by a method such as ion implantation using a resist patterned by a method such as photolithography as a mask.

After implanting the impurity, annealing is appropriately performed to activate the implanted impurity. An anneal temperature can be, for example, about 800 to 1100° C.

In this case, a transfer transistor, a reset transistor, and a selection transistor used for driving a pixel are formed in the pixel region, and a diffusion region, a gate insulation film, a gate electrode, and the like, which are not illustrated, may be formed to form a transistor, a resistive element, and the like for driving a circuit in the peripheral circuit region.

Figure 8:
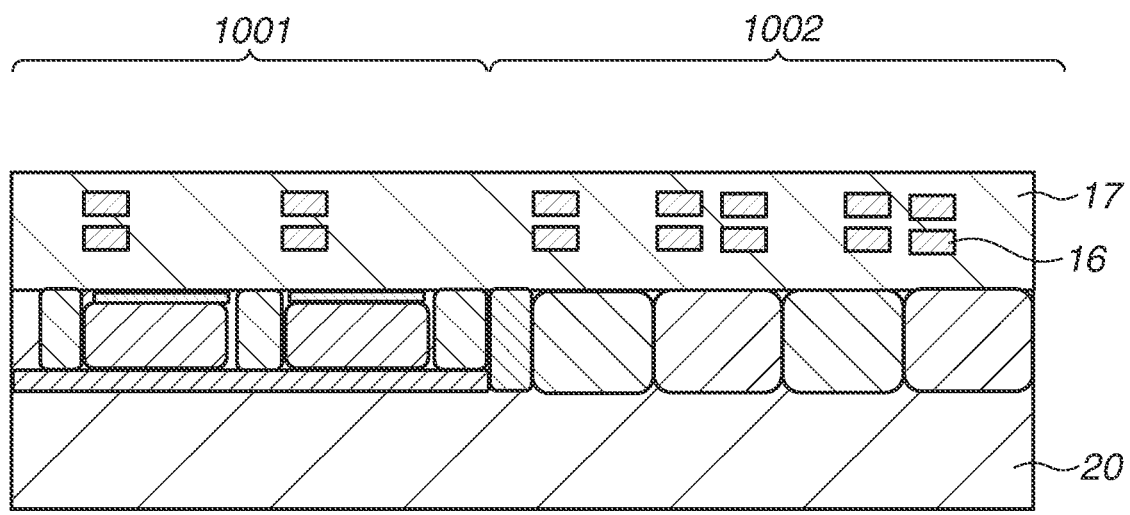
FIG. 8 is an explanatory diagram illustrating the manufacturing method of the photoelectric conversion apparatus according to the fourth exemplary embodiment.

Subsequently, as illustrated in FIG. 8, the wiring 16, the interlayer film 17, a contact via (not illustrated) for connecting the wiring 16 and the silicon substrate 20, and a via (not illustrated) for connecting the wiring each other are sequentially formed on the silicon substrate 20.

Figure 9:
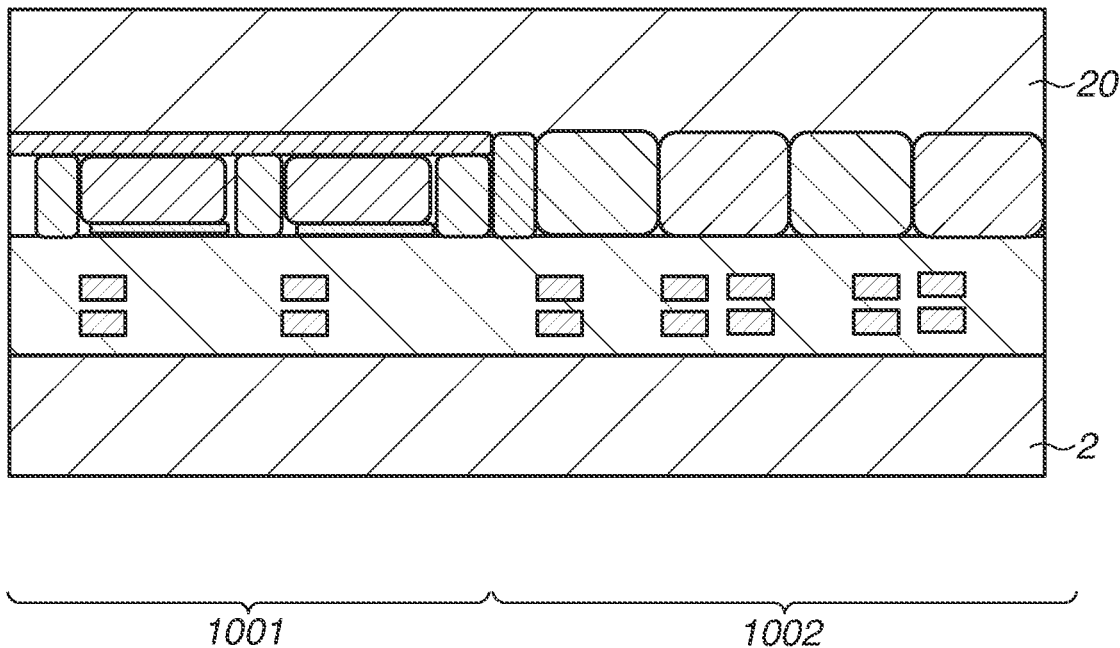
FIG. 9 is an explanatory diagram illustrating the manufacturing method of the photoelectric conversion apparatus according to the fourth exemplary embodiment.

FIG. 9 illustrates the silicon substrate 20 illustrated in FIG. 8 turned upside down and the support substrate 2 bonded to an opposite surface of the light incident surface. In other words, FIG. 9 illustrates the silicon substrate 20 of which the surface corresponding to the light incidence surface of the photoelectric conversion apparatus 1000 is an upper side in the drawing. The silicon substrate 20 and the support substrate 2 can be bonded by, for example, the plasma activated bonding method.

Figure 10:
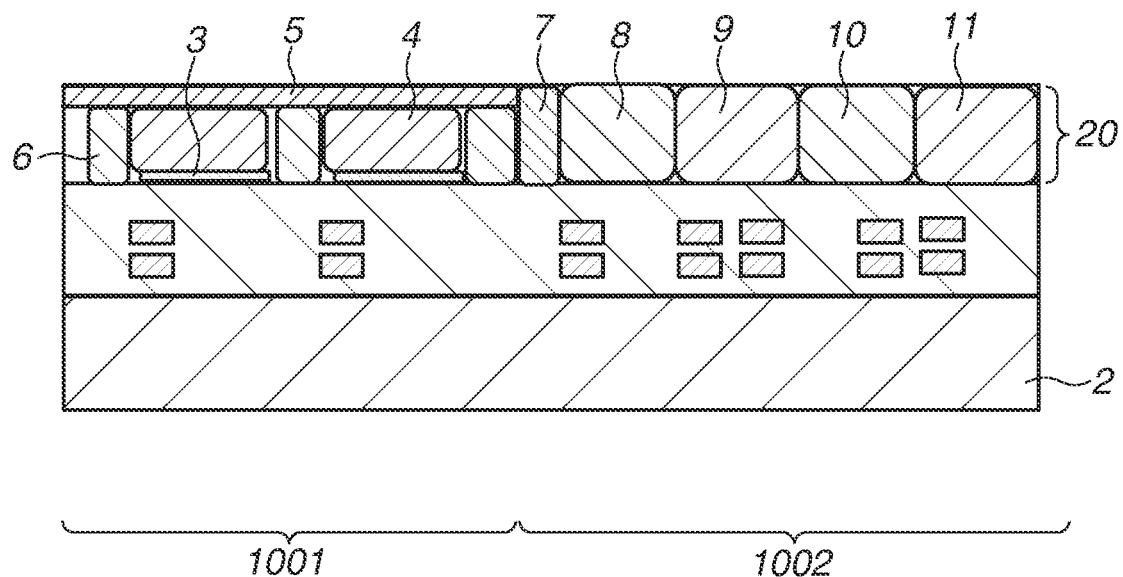
FIG. 10 is an explanatory diagram illustrating the manufacturing method of the photoelectric conversion apparatus according to the fourth exemplary embodiment.

As illustrated in FIG. 10, the silicon substrate 20 on the upper side in FIG. 9 is thinned by a method such as back grind, chemical mechanical polishing (CMP), and wet etching.

In this case, the silicon substrate 20 is thinned to a thickness such that a potential well of each well is formed in the peripheral circuit region and the incident light can be sufficiently photoelectrically converted by a photodiode portion in the pixel region. For example, the silicon substrate 20 is thinned to a thickness in a range of 3 μm or more and 10 μm or less in a direction perpendicular to the light incident surface.

Figure 11:
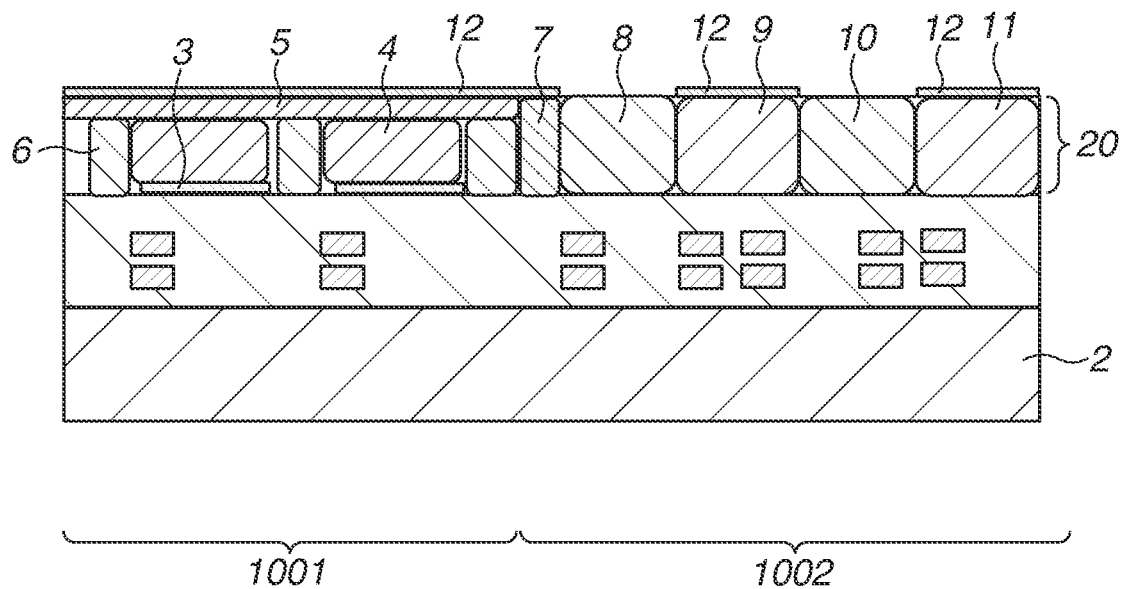
FIG. 11 is an explanatory diagram illustrating the manufacturing method of the photoelectric conversion apparatus according to the fourth exemplary embodiment.

The negative fixed charge film 12 is formed on the thinned silicon substrate 20, as illustrated in FIG. 11.

The negative fixed charge film 12 can be formed of a film of, for example, aluminum oxide, hafnium oxide, tantalum oxide, titanium oxide, and zirconium oxide, but is not limited to these films as long as it is an insulation film that can be a negative fixed charge film, and a plurality of film types may be used. The negative fixed charge film 12 can be formed by a sputtering method, a chemical vapor deposition (CVD) method, an atomic layer deposition (ALD) method and the like.

Next, a resist is applied and is patterned by a photolithography method or other methods. In this case, the resist is patterned so that the resist remains in the regions of the second p-type diffusion region 5, the first p-type well 7, the second p-type well 9, and the third p-type well 11 and is removed from the regions of the first n-type well 8 and the second n-type well 10.

Subsequently, the negative fixed charge film 12 in the regions overlapping the first n-type well 8 and the second n-type well 10 in a plan view is removed by a method such as dry etching and wet etching, and unnecessary resist is stripped. After the resist is stripped, the negative fixed charge film 12 remains in the regions overlapping each of the first p-type well 7, the second p-type well 9, and the third p-type well 11 in a plan view.

The first n-type well 8 and the second n-type well 10 are damaged by etching, but the resist and the negative fixed charge film 12 can protect the second p-type diffusion region 5, the first p-type well 7, the second p-type well 9, and the third p-type well 11 from etching damage. An etching stop film having a thickness within a scope in which the negative fixed charge film 12 does not lose the function of having a fixed charge, for example, a thickness of 10 nm or less, can be provided between the negative fixed charge film 12 and the silicon substrate 20. The etching stop film can further reduce the etching damage to the second p-type diffusion region 5, the first p-type well 7, the second p-type well 9, and the third p-type well 11.

Figure 12:
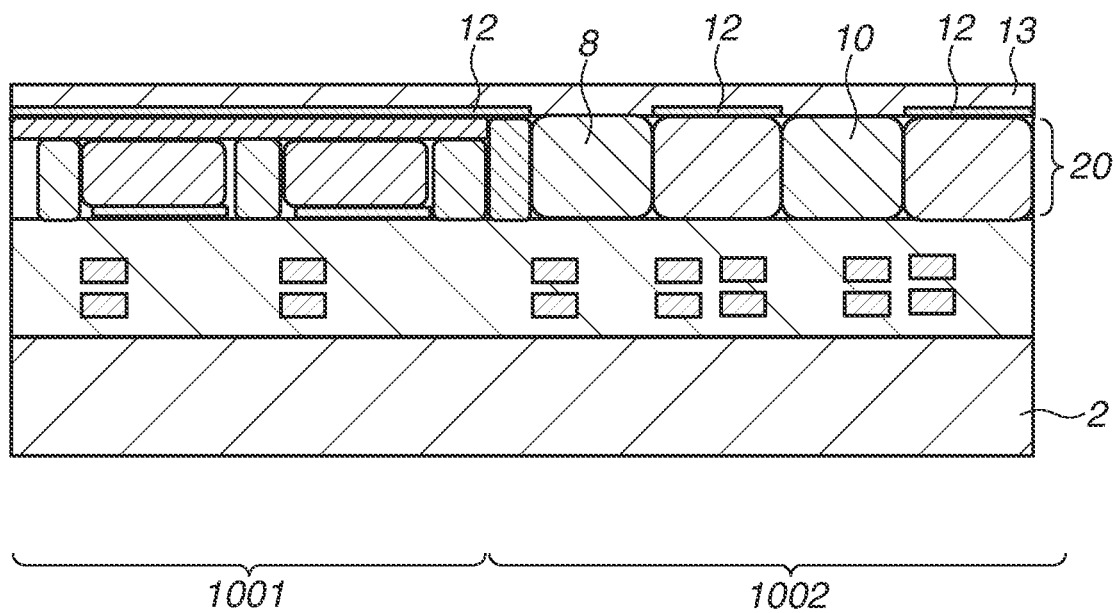
FIG. 12 is an explanatory diagram illustrating the manufacturing method of the photoelectric conversion apparatus according to the fourth exemplary embodiment.

The positive fixed charge film 13 is formed on the silicon substrate 20 and the negative fixed charge film 12, as illustrated in FIG. 12.

According to the present exemplary embodiment, the positive fixed charge film 13 also functions as an interlayer film on the light incidence surface side. However, it is possible that another film that can be a positive fixed charge film, such as a silicon oxide film, is patterned and left on the regions on the first n-type well 8 and the second n-type well 10, and the another film (the positive fixed charge film) is not used as an interlayer film.

Figure 13:
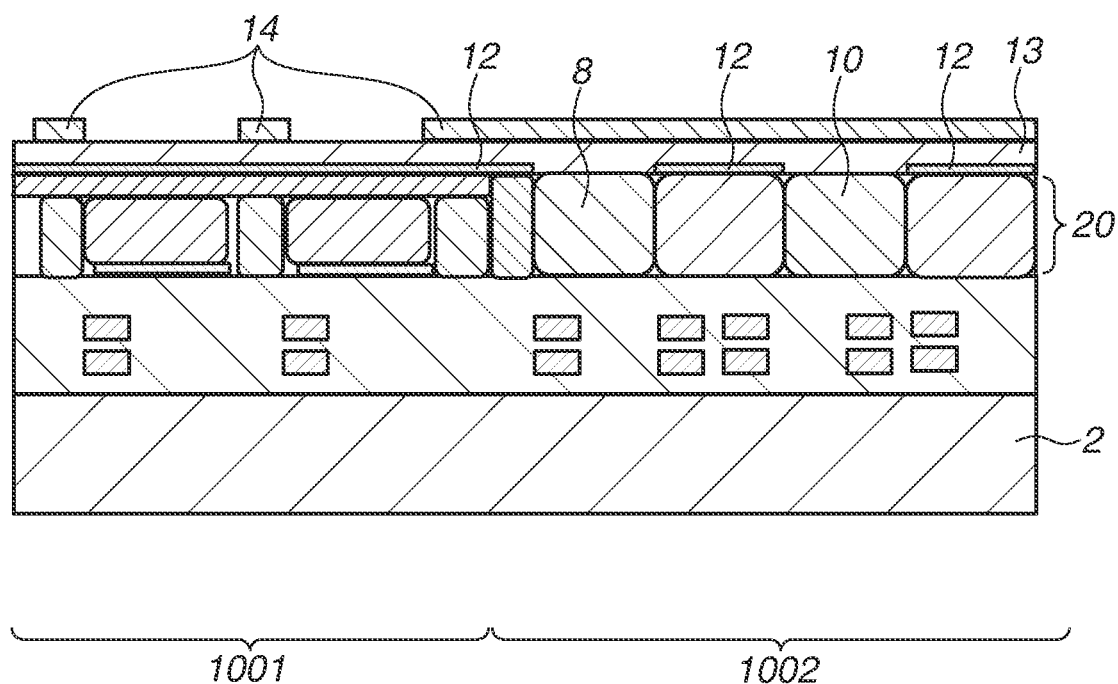
FIG. 13 is an explanatory diagram illustrating the manufacturing method of the photoelectric conversion apparatus according to the fourth exemplary embodiment.

The light shielding film 14 is formed on the positive fixed charge film 13 illustrates in FIG. 13.

Figure 14:
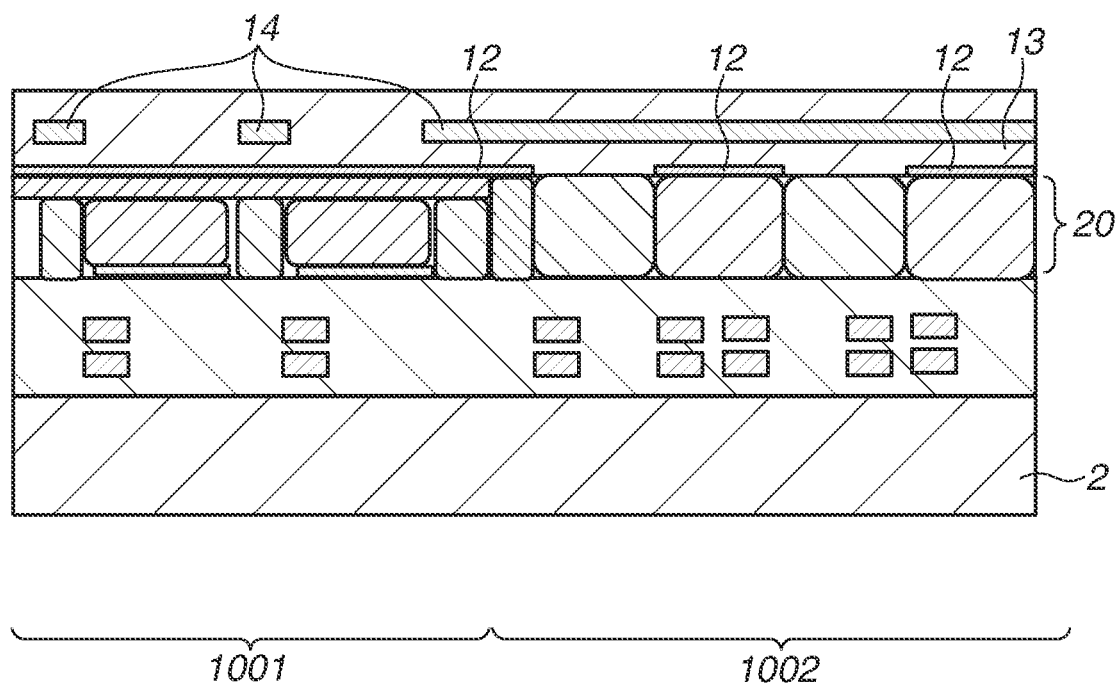
FIG. 14 is an explanatory diagram illustrating the manufacturing method of the photoelectric conversion apparatus according to the fourth exemplary embodiment.

As a material of the light shielding film, a material having a low light transmittance such as aluminum, tungsten, and copper can be selected. An interlayer film is formed by covering the formed light shielding film 14 with the same material as that of the positive fixed charge film 13 as illustrated in FIG. 14, and further, a color filter and a microlens, which are not illustrated, are formed on the interlayer film.

Thus, a CMOS image sensor in which etching damage in a peripheral circuit portion, which can be a noise source, is reduced and a leakage current between wells is reduced can be completed by the above-described manufacturing method.

Figure 15:
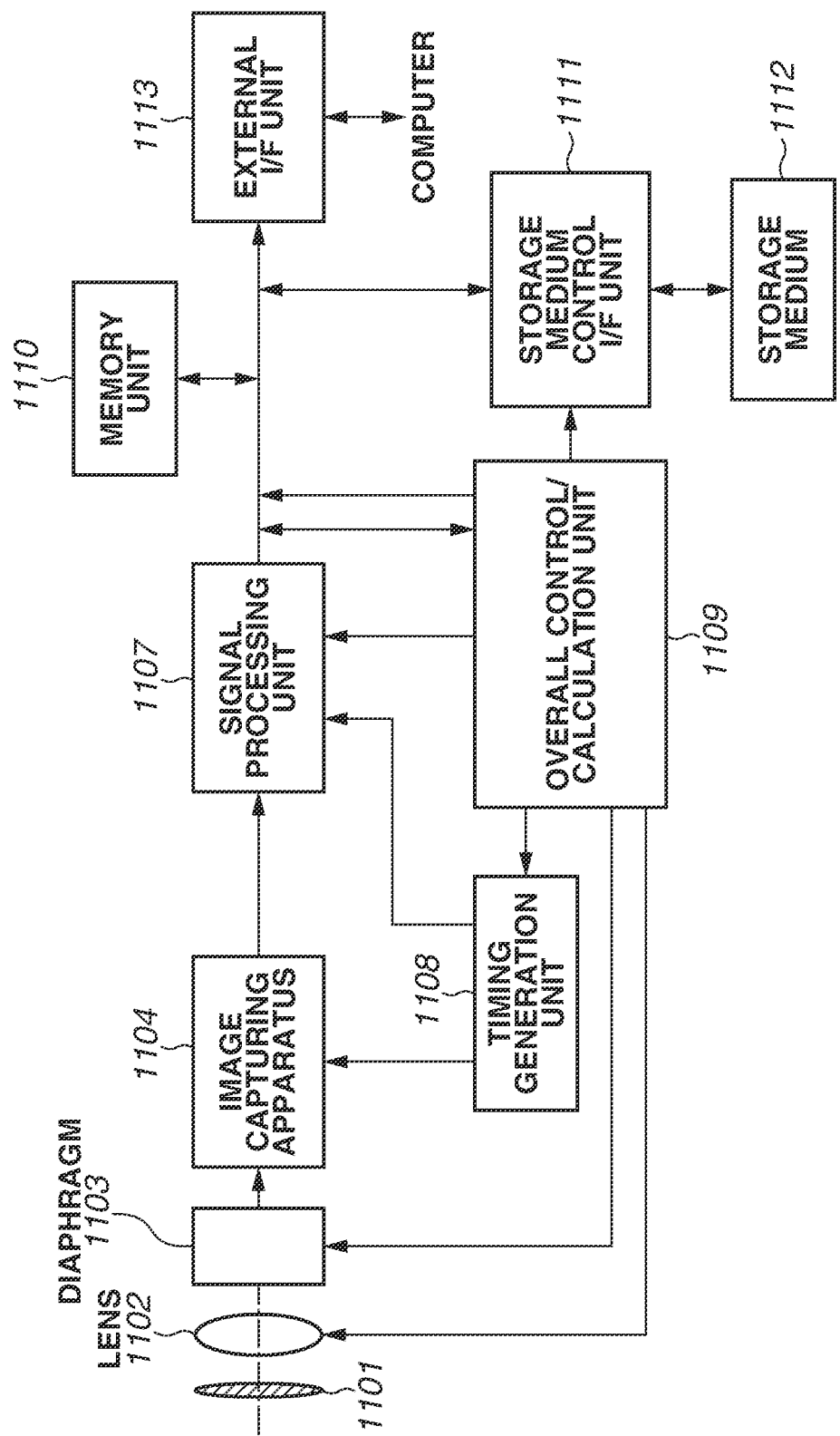
FIG. 15 is a functional block diagram of a photoelectric conversion system according to a fifth exemplary embodiment.

A photoelectric conversion system according to a fifth exemplary embodiment is to be described with reference to FIG. 15. FIG. 15 is a block diagram illustrating a schematic configuration of the photoelectric conversion system according to the present exemplary embodiment.

The photoelectric conversion apparatus according to the above-described first to third exemplary embodiments can be applied to various photoelectric conversion systems. Examples of the photoelectric conversion systems to which the photoelectric conversion apparatus can be applied include a digital still camera, a digital camcorder, a surveillance camera, a copying machine, a facsimile machine, a mobile phone, an on-vehicle camera, and an observation satellite. A camera module including an optical system such as a lens and an image capturing apparatus is also included in the photoelectric conversion system. FIG. 15 is a block diagram illustrating a digital still camera as an example of the photoelectric conversion system.

The photoelectric conversion system illustrated in FIG. 15 includes an image capturing apparatus 1104 as an example of the photoelectric conversion apparatus and a lens 1102 that forms an optical image of an object on the image capturing apparatus 1104. The photoelectric conversion system further includes a diaphragm 1103 for varying a light amount passing through the lens 1102 and a barrier 1101 for protecting the lens 1102. The lens 1102 and the diaphragm 1103 are optical systems that collect light on the image capturing apparatus 1104. The image capturing apparatus 1104 is the photoelectric conversion apparatus according to any of the above-described exemplary embodiments and converts an optical image formed on the lens 1102 into an electrical signal.

The photoelectric conversion system includes a signal processing unit 1107 as an image generation unit configured to generate an image by processing an output signal output from the image capturing apparatus 1104. The signal processing unit 1107 performs various corrections and compression as necessary to perform an operation for outputting image data. The signal processing unit 1107 may be formed on a semiconductor substrate on which the image capturing apparatus 1104 is arranged or on a semiconductor substrate different from the semiconductor substrate on which the image capturing apparatus 1104 is arranged.

The photoelectric conversion system further includes a memory unit 1110 for temporarily storing image data and an external interface (I/F) unit 1113 for communicating with an external computer and the like. The photoelectric conversion system further includes a storage medium 1112 such as a semiconductor memory for storing or reading captured image data and a storage medium control interface (I/F) unit 1111 for storing or reading data in the storage medium 1112. The storage medium 1112 may be built into or detachably mounted to the photoelectric conversion system.

Further, the photoelectric conversion system includes an overall control/calculation unit 1109 configured to control various calculations and an entire digital still camera and a timing generation unit 1108 configured to output various timing signals to the image capturing apparatus 1104 and the signal processing unit 1107. The timing signal and the like may be input from the outside, and the photoelectric conversion system may include at least the image capturing apparatus 1104 and the signal processing unit 1107 configured to process an output signal output from the image capturing apparatus 1104.

The image capturing apparatus 1104 outputs an image capturing signal to the signal processing unit 1107. The signal processing unit 1107 performs predetermined signal processing on the image capturing signal output from the image capturing apparatus 1104 and outputs image data. The signal processing unit 1107 generates an image using the image capturing signal.

As described above, according to the present exemplary embodiment, the photoelectric conversion system to which the photoelectric conversion apparatus (the image capturing apparatus) according to any of the above-described exemplary embodiments is applied can be realized.

Figure 16A:
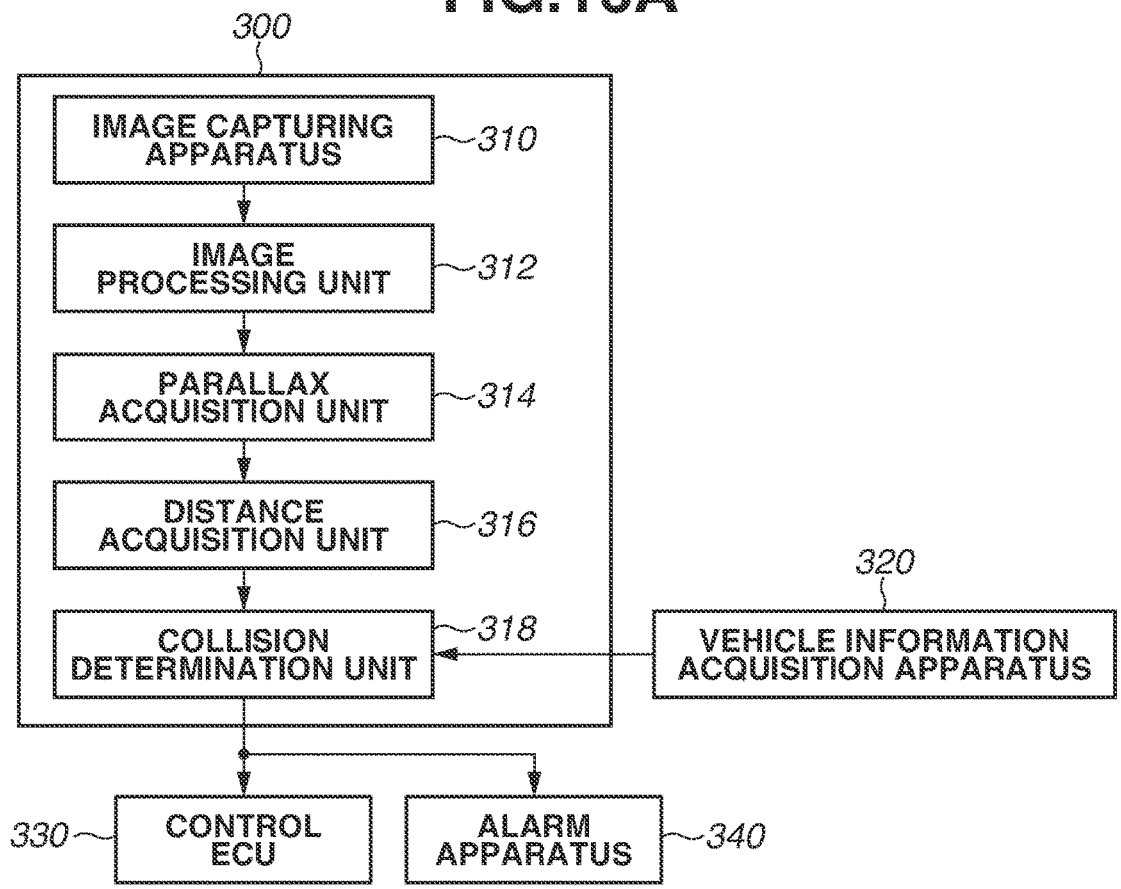
FIGS. 16A and 16B are diagrams each illustrating a photoelectric conversion system and a moving object according to a sixth exemplary embodiment.
Figure 16B:
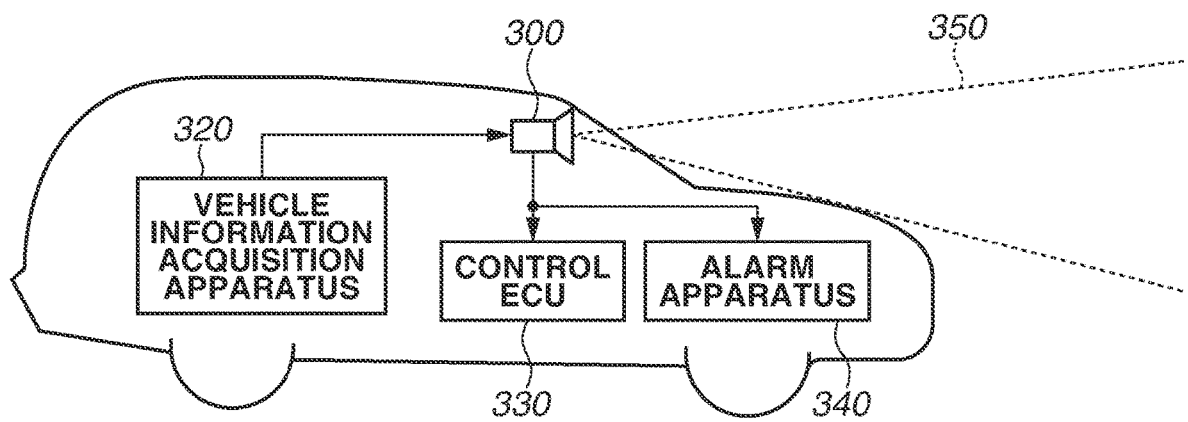

A photoelectric conversion system and a moving object according to a sixth exemplary embodiment are to be described with reference to FIGS. 16A and 16B. FIGS. 16A and 16B illustrate configurations of the photoelectric conversion system and the moving object according to the present exemplary embodiment.

FIG. 16A illustrates an example of the photoelectric conversion system related to an on-vehicle camera. A photoelectric conversion system 300 includes an image capturing apparatus 310. The image capturing apparatus 310 is the photoelectric conversion apparatus (the image capturing apparatus) according to any of the above-described exemplary embodiments. The photoelectric conversion system 300 includes an image processing unit 312 configured to perform image processing on a plurality of pieces of image data acquired by the image capturing apparatus 310 and a parallax acquisition unit 314 configured to calculate parallax (a phase difference of a parallax image) from the plurality of pieces of image data acquired by the photoelectric conversion system 300. The photoelectric conversion system 300 includes a distance acquisition unit 316 configured to calculate a distance to an object based on the calculated parallax and a collision determination unit 318 configured to determine whether there is a possibility of collision based on the calculated distance. The parallax acquisition unit 314 and the distance acquisition unit 316 are examples of a distance information acquisition unit configured to acquire distance information about an object. Specifically, the distance information is information related to parallax, a defocus amount, a distance to the object, and the like. The collision determination unit 318 may determine a collision possibility using any piece of the distance information. The distance information acquisition unit may be realized by specially designed hardware or a software module. The distance information acquisition unit may be realized by a field-programmable gate array (FPGA), an application specific integrated circuit (ASIC), or a combination thereof.

The photoelectric conversion system 300 is connected to a vehicle information acquisition apparatus 320 and can acquire vehicle information such as a vehicle speed, a yaw rate, and a steering angle. The photoelectric conversion system 300 is connected to a control engine control unit (ECU) 330, which is a control unit that outputs a control signal for generating a braking force to the vehicle based on a determination result of the collision determination unit 318. The photoelectric conversion system 300 is also connected to an alarm apparatus 340 configured to issue an alarm to a driver based on the determination result of the collision determination unit 318. For example, in a case where the collision possibility is high as a determination result of the collision determination unit 318, the control ECU 330 controls the vehicle to avoid a collision and reduce damage by applying a brake, releasing an accelerator, suppressing an engine output, and the like. The alarm apparatus 340 alarms the driver by issuing a sound alarm, displaying alarm information on a screen of a car navigation system, or giving vibration to a seat belt or steering.

According to the present exemplary embodiment, the photoelectric conversion system 300 captures an image of a surrounding, for example, a front or a rear of the vehicle. FIG. 16B illustrates the photoelectric conversion system 300 in a case where an image of the front of the vehicle (an imaging range 350) is to be captured. The vehicle information acquisition apparatus 320 transmits an instruction to the photoelectric conversion system 300 or the image capturing apparatus 310. Accuracy of distance measurement can be further improved with the above-described configuration.

The example of controlling the vehicle so as not to collide with another vehicle is described above, but the present exemplary embodiment can also be applied to automatic driving control for following another vehicle and automatic driving control for keeping a vehicle within a lane. Further, the photoelectric conversion system can be applied not only to a vehicle such as a car but also to a moving object (a moving apparatus) such as a ship, an aircraft, or an industrial robot. In addition, the photoelectric conversion system can be applied to not only a moving object but also a device that widely utilizes object recognition such as intelligent transport systems (ITS).

A modified exemplary embodiment is to be described. The disclosure can be variously modified without being limited to the above-described exemplary embodiments.

For example, an example in which a part of the configuration of any of the exemplary embodiments is added to the other exemplary embodiments and an example in which a part of the configuration is replaced with the other exemplary embodiments are also included in the exemplary embodiments of the disclosure.

The photoelectric conversion apparatus in which the substrate including the semiconductor substrate and the support substrate are laminated is described as the example in each of the exemplary embodiments, but the application of the disclosure is not limited to the photoelectric conversion apparatus having the laminated structure. The disclosure can also be applied to, for example, a photoelectric conversion apparatus that does not include a support substrate and a photoelectric conversion apparatus in which three substrates, i.e., a substrate having a semiconductor substrate, a support substrate, and a substrate on which a signal processing unit and the like are formed, are stacked.

The photoelectric conversion system according to the above-described fifth and sixth exemplary embodiments is the example of the photoelectric conversion system to which the photoelectric conversion apparatus can be applied, and the photoelectric conversion system to which the photoelectric conversion apparatus according to the disclosure can be applied is not limited to the configurations illustrated in FIGS. 15, 16A, and 16B.

The exemplary embodiments described above are merely examples for implementing the disclosure, so that the examples should not be construed restrictively limiting the technical scope of the disclosure. In other words, the disclosure can be implemented in the various forms without departing from the technical idea or the main features thereof.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2021-138747, filed Aug. 27, 2021, which is hereby incorporated by reference herein in its entirety.

What is claimed is:

1. An apparatus including a substrate, the apparatus comprising:
   a surface,
   wherein the substrate includes a conversion unit and a circuit region where a signal generated by the conversion unit is to be processed,
   wherein the circuit region includes a p-type semiconductor region and an n-type semiconductor region at positions different from each other in a plan view from a surface side,
   wherein a fixed charge film having a negative fixed charge is provided on the surface side of the p-type semiconductor region,
   wherein a film having a positive fixed charge is provided on the surface side of the n-type semiconductor region, and
   wherein the circuit region includes one or both of a configuration in which the film having the positive fixed charge does not extend from the surface side of the n-type semiconductor region to the surface side of the p-type semiconductor region or extends to a part of the surface side of the p-type semiconductor region and a configuration in which the film having the negative fixed charge does not extend from the surface side of the p-type semiconductor region to the surface side of the n-type semiconductor region or extends to a part of the surface side of the n-type semiconductor region.

2. The apparatus according to claim 1, wherein the film having the negative fixed charge extends between the n-type semiconductor region and the film having the positive fixed charge.

3. The apparatus according to claim 1, wherein the film having the positive fixed charge extends between the p-type semiconductor region and the film having the negative fixed charge.

4. The apparatus according to claim 1,
   wherein the conversion unit includes an electron accumulation type photodiode, and
   wherein a film having a negative fixed charge is formed on the surface side of the conversion unit.

5. The apparatus according to claim 1,
   wherein the conversion unit includes a hole accumulation type photodiode, and
   wherein a film having a positive fixed charge is formed on the surface side of the conversion unit.

6. The apparatus according to claim 1,
   wherein the p-type semiconductor region includes a first p-type semiconductor region and a second p-type semiconductor region,
   wherein the n-type semiconductor region is arranged between the first p-type semiconductor region and the second p-type semiconductor region, and
   wherein the first p-type semiconductor region and the second p-type semiconductor region are separated by a region including the film having the positive fixed charge that overlaps the n-type semiconductor region in a plan view from the surface side.

7. The apparatus according to claim 1,
   wherein the n-type semiconductor region includes a first n-type semiconductor region and a second n-type semiconductor region,
   wherein the p-type semiconductor region is arranged between the first n-type semiconductor region and the second n-type semiconductor region, and
   wherein the first n-type semiconductor region and the second n-type semiconductor region are separated by a region including the film having the negative fixed charge that overlaps the p-type semiconductor region in a plan view from the surface side.

8. The apparatus according to claim 1, wherein a thickness of the substrate is 10 μm or less in a direction perpendicular to the surface.

9. The apparatus according to claim 1, further comprising a substrate stacked on the substrate and including a transistor configured to read a signal generated by the conversion unit.

10. A moving object including the apparatus according to claim 1, the moving object comprising:
    a control unit configured to control a movement of the moving object using a signal to be output from the apparatus.

11. A system comprising:
    the apparatus according to claim 1; and
    a signal processing unit configured to generate an image using a signal to be output from the apparatus.

12. The system according to claim 11, wherein the film having the negative fixed charge extends between the n-type semiconductor region and the film having the positive fixed charge.

13. The system according to claim 11, wherein the film having the positive fixed charge extends between the p-type semiconductor region and the film having the negative fixed charge.

14. The system according to claim 11,
wherein the conversion unit includes an electron accumulation type photodiode, and
wherein a film having a negative fixed charge is formed on the surface side of the conversion unit.

15. A substrate comprising:
a conversion unit; and
a circuit region where a signal generated by the conversion unit is to be processed,
wherein the circuit region includes a p-type semiconductor region and an n-type semiconductor region at positions different from each other in a plan view from a surface side,
wherein a film having a negative fixed charge is provided on the light incidence surface side of the p-type semiconductor region,
wherein a film having a positive fixed charge is provided on the surface side of the n-type semiconductor region, and
wherein the circuit region includes one or both of a configuration in which the film having the positive fixed charge does not extend from the surface side of the n-type semiconductor region to the surface side of the p-type semiconductor region or extends to a part of the surface side of the p-type semiconductor region and a configuration in which the film having the negative fixed charge does not extend from the surface side of the p-type semiconductor region to the surface side of the n-type semiconductor region or extends to a part of the surface side of the n-type semiconductor region.

* * * * *